United States Patent [19]
Knoell et al.

[11] Patent Number: 5,039,577
[45] Date of Patent: Aug. 13, 1991

[54] HYBRID METAL MATRIX COMPOSITE CHASSIS STRUCTURE FOR ELECTRONIC CIRCUITS

[75] Inventors: Albert C. Knoell, La Crescenta; Timothy A. Loftin, Semi Valley, both of Calif.

[73] Assignee: Hughes Aircraft Company, Los Angeles, Calif.

[21] Appl. No.: 531,220

[22] Filed: May 31, 1990

[51] Int. Cl.$^5$ .......................... C22C 21/00; B32B 5/30
[52] U.S. Cl. ................................. 428/650; 428/614; 428/654
[58] Field of Search .................. 428/614, 654, 650

[56] References Cited
FOREIGN PATENT DOCUMENTS
62-127159 6/1987 Japan .

Primary Examiner—R. Dean
Assistant Examiner—David W. Schumaker
Attorney, Agent, or Firm—Leonard A. Alkov; Wanda K. Denson-Low

[57] ABSTRACT

A hybrid chassis structure including a layer of particulate reinforced metal and a layer of graphite fiber reinforced metal bonded to the particulate reinforced metal layer, wherein the overall thermal expansion, thermal conductivity and elasticity properties of the bonded hybrid structure are determined by controlling the properties of the respective layers.

14 Claims, 1 Drawing Sheet

HYBRID METAL MATRIX COMPOSITE CHASSIS STRUCTURE FOR ELECTRONIC CIRCUITS

BACKGROUND OF THE INVENTION

The disclosed invention is directed generally to composite chassis structures for electronic circuits, and more particularly is directed to a hybrid metal matrix composite chassis structure having different metal matrix composite layers metallurgically bonded together.

As electronic circuitry becomes smaller as a result of integrated circuit advances, the amount of power dissipated per unit volume increase while the size of packaging (e.g., box-like containers with external connectors) typically decreases. The net result is increased thermal energy which must be dissipated over a smaller area. The packaging material, therefore, becomes an increasingly significant factor in the over-all performance and reliability of the packaged electronic circuitry.

A further consideration with the increased thermal energy density is unmatched thermal expansion characteristics. For example, an alumina substrate supporting electronic circuitry can be bonded to a planar surface of a circuit package, which typically would comprise a different material such as aluminum. Alumina and aluminum have different coefficients of thermal expansion, and temperature variation would result in mechanical stresses. If the stresses are large enough, the substrate-to-package bond could be fractured outright. Lower intensity stresses could degrade the bond through fatigue over the lifetime of the packaged system. In any event, stresses resulting from expansion mismatch can degrade the bond, increasing thermal resistance in the steady-state operating temperature and shortening the life of the packaged circuitry.

SUMMARY OF THE INVENTION

It would therefore be an advantage to provide an electronic circuit chassis structure which provides for increased thermal conductivity.

Another advantage would be to provide an electronic circuit chassis having a thermal coefficient of expansion that can be controlled.

A further advantage would be to provide an electronic circuit chassis structure having increased thermal conductivity and a thermal coefficient of expansion that can be controlled.

The foregoing and other advantages are provided in the hybrid chassis structure of the invention which includes a layer of particulate reinforced metal, and a layer of graphite fiber reinforced metal bonded to the particulate reinforced metal layer, wherein the overall properties of the bonded hybrid structure are determined by controlling the properties of the respective layers.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
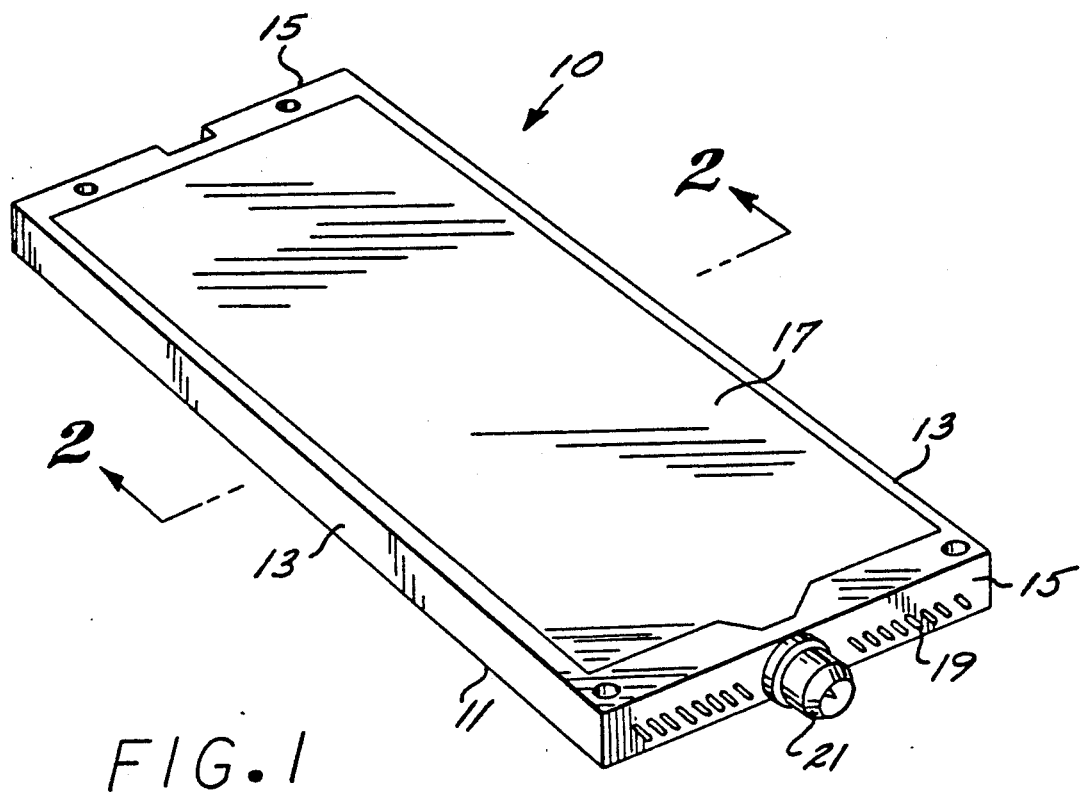
FIG. 1 is a schematic perspective view of an illustrative example of an electronic circuit chassis structure in accordance with the invention.

In the following detailed description and in the several figures of the drawing, like elements are identified with like reference numerals.

Referring now to FIG. 1, shown therein is an electronic circuit chassis structure 10 having a generally rectangular shape and including a bottom wall 11. Oppositely located sidewalls 13 and oppositely located end walls 15 are secured to the bottom wall 11. A cover 17 is secured to the side walls 13 and the end walls 15 seals the chassis structure 10. By way of illustrative example, electrical connectors 19, 21 can be located at one of the end walls 15.

By way of specific example, electronic circuitry to be secured within the chassis structure 10 would include appropriate substrates such as alumina that would bonded to the inside surface of the bottom wall 11, so as to provide structural integrity as well as thermal conduction between the substrates and the bottom wall 11.

Figure 2:
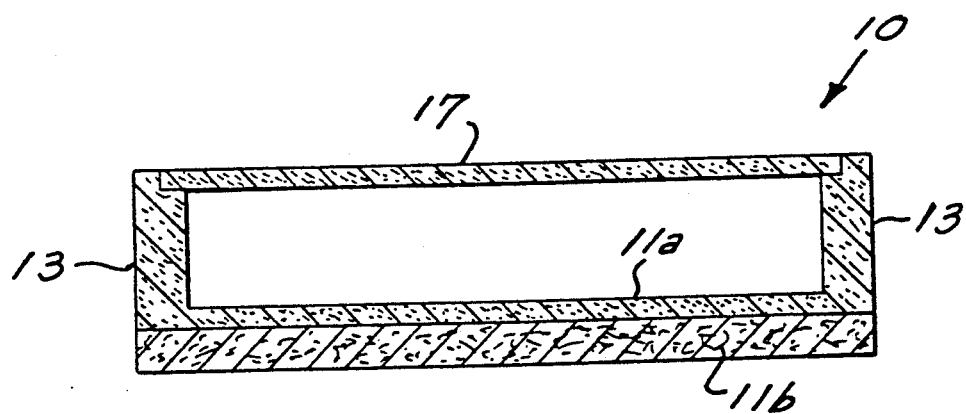
FIG. 2 is a cross-sectional view of the electronic circuit chassis of FIG. 1.

Referring specifically to FIG. 2, the bottom wall 11 which supports the substrates carrying the electronic circuitry is a hybrid composite comprising two bonded metal matrix composite layers 11a, 11b. The hybrid composite forms a bottom wall 11 that has high thermal conductivity and a coefficient of thermal expansion that can be closely matched to that of the substrates supported by the bottom wall 11. By way of specific example, the inside composite layer 11a is particulate reinforced aluminum, as are the sidewalls 13 and end walls 15, and the outside composite layer 11b is graphite fiber reinforce aluminum.

The particulate aluminum composite layer 11a is made by incorporating a powder reinforcement in the matrix metal. The powder reinforcement is typically a ceramic such as silicon carbide or boron carbide, and can comprise, for example, as much as 55% of the composite volume.

The graphite aluminum composite layer 11b is formed by incorporating graphite fibers into the matrix metal. The fibers may be of several varieties, pitch-based or PAN-based for example, with typical modulii of elasticity from 370 GPa to 950 GPa. The fibers can comprise, for example, as much as 60% of the volume of the composite.

The constituent composite layers of the hybrid composite are bonded by using any of several processes. For example, the constituent composites can be plated with many surface metals, including copper, tin, nickel, silver, gold and aluminum using commercial plating processes, which can then be joined using soldering, brazing, electron-beam welding or laser welding. Unplated components can be joined by diffusion bonding, for example, by application of pressure and heat.

The procedure for defining a hybrid bottom wall 11 for a given application would start by defining the desired hybrid properties or characteristics, namely thermal expansion, thermal conductivity and elasticity. Since the orientation of the graphite fibers in the aluminum graphite composite affects these characteristics, such characteristics must be described relative to orientation. For ease of reference, the long dimension of the hybrid shall be the longitudinal direction (denoted by the subscript l) and the short dimension shall be the transverse direction (denoted by the subscript t). Thus, the properties that need to be determined for the hybrid (denoted by the subscript h) are longitudinal and transverse coefficients of thermal expansion ($A_{h,l}$ and $A_{h,t}$), longitudinal and transverse thermal conductivities ($K_{h,l}$ and $K_{h,t}$), and longitudinal and transverse modulii of elasticity $E_{h,l}$ and $E_{h,t}$).

These properties of a hybrid are weighted averages of the properties of all the layers, based on relative thicknesses of the constituent layers of composite material. Thus, the overall properties of the hybrid can be expressed as a function of the properties of the constituent composite layers. For a hybrid having two constituent composites, the fractional relative thicknesses of the graphite reinforced aluminum and the particulate reinforced aluminum are as follows:

$$T = \frac{t_{xgal}}{t_{gal} + t_{pal}} \text{ and } 1 - T = \frac{t_{pal}}{t_{gal} + t_{pal}}$$

where T is the fractional thickness of the graphite reinforced aluminum composite, (1-T) is the fractional thickness of the particulate reinforced aluminum composite, $t_{gal}$ is the total thickness of the graphite reinforced aluminum component (which can be more than one composite layer) and $t_{pal}$ is the total thickness of the particulate reinforced aluminum component (which also can be more than once composite layer). From relative thickness, the respective overall properties of the hybrid are expressed in terms of the properties of the constituent composites as follows:

$$K_{n,l} = T K_{gal,l} + (1-T)(K_{pal})$$

$$K_{n,t} = T K_{gal,t} + (1-T)(K_{pal})$$

$$A_{h,l} = \frac{A_{gal,l} T E_{xgal,l} + A_{pal}(1 - T)E_{pal}}{T E_{gal,l} + (1 - T)E_{pal}}$$

$$A_{h,t} = \frac{A_{gal,t} T E_{gal,t} + A_{pal}(1 - T)E_{pal}}{T E_{gal,l} + (1 - T)E_{pal}}$$

$$E_{h,l} = T E_{gal,l} + (1-T)E_{pal}$$

$$E_{h,t} = T E_{gal,t} + (1-T)E_{pal}$$

where A, K, and E respectively represent a coefficient of thermal expansion, a thermal conductivity, and a modulus of elasticity; and where the subscript "gal" identifies the graphite reinforced aluminum composite, the subscript "pal" identifies the particulate reinforced aluminum composite, the subscript "l" identifies the longitudinal orientation, and the subscript "t" identifies the transverse orientation.

It should be noted from the foregoing that the of the the graphite reinforced aluminum composites depend on direction (i.e., longitudinal and transverse). In particular, the properties depend on the volume loading of graphite fibers and the orientation of the fibers. By way of specific example, a layer of graphite reinforced aluminum composite can be formed of a plurality of plies of graphite aluminum, where each ply includes unidirectionally oriented fibers.

The properties of a unidirectional ply of graphite reinforced aluminum having graphite fibers oriented in the longitudinal direction can be expressed as follows:

$$A_{tgal} = A_{al}$$

$$A_{1gal} = \frac{.59 v A_{1gr} E_{1gr} + (1 - v)A_{al} E_{al}}{v E_{1gr} + (1 - v)E_{al}}$$

$$K_{lgal} = v K_{lgr} + (1-v) K_{al}$$

$$K_{tgal} = [v/K_{tgr} + (1-v)/K_{al}]^{-1}$$

$$E_{lgal} = v E_{lgr} + (1-v) E_{al}$$

$$E_{tgal} = (1-v) E_{al}$$

where the subscript "lgr" identifies the longitudinal properties of the graphite fiber utilized, the subscript "tgr" identifies the transverse properties of the graphite fiber utilized, the subscript "al" identifies the properties of the aluminum utilized, the subscript "lgal" identifies the longitudinal properties of the unidirectional graphite-aluminum ply, the subscript "tgal" identifies the transverse properties of such ply, and "v" is the fractional volume of the composite ply comprising graphite. The equations for $A_{tgal}$ and $A_{lgal}$ were derived empirically, and the equation for $E_{tgal}$ approximates the transverse modulus of graphite as zero, which is appropriate since it is very low.

If the graphite-aluminum composite is formed of crossed plies, where each ply has the same properties, then the overall properties of such cross-ply composite is the weighted average of the constituent plies, based on relative thickness. If X is the fraction of the total composite thickness containing graphite fibers oriented in the overall longitudinal direction, then the properties of the cross-ply graphite-aluminum composite, identified by the subscripts "gal,l" and "gal,t", are given by:

$$K_{gal,l} = X K_{lgal} + (1-X) K_{tgal}$$

$$K_{gal,t} = (X-1) K_{lgal} + X K_{tgal}$$

$$A_{gal,l} = \frac{X A_{lgal} E_{lgal} + (1 - X) A_{tgal} E_{tgal}}{X E_{lgal} + (1 - X) E_{tgal}}$$

$$A_{gal,t} = \frac{(1 - X) A_{lgal} E_{lgal} + X A_{tgal} E_{tgal}}{X E_{lgal} + (1 - X) E_{tgal}}$$

$$E_{gal,l} = X E_{lgal} + (1-X) E_{tgal}$$

$$E_{gal,l} = (1-X) E_{lgal} + X E_{tgal}$$

It should be realized that if the thicknesses of the plies in the longitudinal and transverse directions are made equal, then the overall properties of the cross-ply composite are the same in each direction: $K_{gal,l} = K_{gal,t}$; $A_{gal,l} = A_{gal,t}$; $E_{gal,l} = E_{gal,t}$. For such case, X=0.5 and substitution of this value for X in the above equations demonstrates that the properties are the same in each direction.

The properties of the graphite and aluminum are readily available from manufacturers. The properties of P100 graphite fiber, for example, are typically as follows in SI units:

$A_{lgr} = 1.6$ ppm/K $A_{tgr}$ is unavailable and not required since the composite characteristic is substantially equal to that of aluminum.

$K_{lgr} = 500$ W/m*K $K_{tgr} = 29$ W/m*K and $E_{lgr} = 680$ GPa

As mentioned above, the transverse modulus, $E_{tgr}$ is very low, and is approximated by zero in calculations. The properties of 6061 aluminum which can be utilized in the invention are typically as follows in SI units:

$A_{al} = 23$ ppm/K
$K_{al} = 189$ W/m*K
$E_{al} = 68$ GPa

As to the particulate reinforced aluminum composite, the properties of silicon-carbide reinforced 6061 aluminum, identified by the subscript "pal", have been empirically determined to be as follows:

$$K_{pal} = 179 - 199 v_p + 131 v_p^2 \text{ W/mK},$$

$$A_{pal} = 23 - 76 v_p + 171 v_p^2 - 1\,151 v_p^3 \text{ ppm/K}$$

$$E_{pal} = 68 + 188 v_p \text{ GPa}$$

where $v_p$ is the volume fraction silicon-carbide forms of the composite, typically between 0 and 0.55.

From the foregoing analyses, it can be recognized that the properties of the hybrid can be varied by adjusting four basic material variables: the fractional part by volume of the graphite in the graphite-aluminum composite, the fractional part by volume of the particulate material in the particulate-aluminum, the fractional part of a cross-ply aluminum-graphite composite thickness containing fibers oriented in the overall longitudinal direction, and the fractional part of the hybrid thickness comprised of the graphite-aluminum.

Increasing the volume loading of graphite in the composite increases the modulus of elasticity and thermal conductivity in the fiber direction and decreases them in the transverse direction. Increasing the fiber volume decreases the thermal expansion rate in the fiber direction without significantly affecting it in the transverse direction. Increasing the relative thickness of the graphite-aluminum component of the hybrid has the same effect. In other words, for a graphite aluminum composite having a given fiber volume percentage, increasing the relative thickness of that composite in the hybrid decreases the thermal expansion rate of the hybrid in the fiber direction without significantly affecting it in the transverse direction.

Cross-plies in the graphite-aluminum component decreases the anisotropy of the composite. Adjusting the relative number of plies oriented in the longitudinal direction adjusts the relative longitudinal and transverse properties of the composite. If there are equal numbers of plies in each direction, the composite has the same properties in both directions.

Increasing the particulate-reinforced component of the hybrid usually increases the thermal expansion rate and decreases the stiffness and thermal conductivity, depending on the relative contributions of the particulate-aluminum and graphite-aluminum.

From the foregoing it should be appreciated that the thermal conductivity of the hybrid is dependent on the orientation of the fibers in the graphite aluminum composite. Such directionality can be advantageously utilized, for example, in a chassis structure which is relatively long in one direction and wherein it is desired to have heat sinks at each end of the long dimension. In such case, the graphite composite could have graphite fibers oriented primarily, if not exclusively, in alignment with the long dimension to increase the thermal conductivity in the direction of the long dimension, so long as the different expansion characteristics in the long and short directions are acceptable. It should be noted that in a package having a long dimension that is much greater than the short dimension, the properties in the long dimension direction will typically be more critical. In a package in which the dimensions in the two plane directions are closer to being equal, the potential for removing heat from all four edges and matching of thermal expansion coefficients could make a cross-plied aluminum graphite composite appropriate.

It should be appreciated that while adjustment of the respective composite variables is a good starting point, typically an iterative process will be followed to arrive at an acceptable trade-off between the target properties: a trial composition is assumed, the resulting properties calculated, the composition adjusted and new results calculated, and so forth until an acceptable design is achieved.

By way of illustrative example, the following can be representative desired hybrid properties:

$K_{h,l} \geq 190$ W/mk
$K_{n,t} \geq 190$ W/mk
$A_{h,l} = 6\text{-}7$ ppm/K
$A_{h,t} = 6\text{-}7$ ppm/K
$E_{h,l} > 100$ GPa
$E_{h,t} \geq 100$ GPa A hybrid composite configuration having a graphite fractional volume of 0.55, a particulate volume fraction of 0, a cross-ply fractional thickness of 0.5, and a graphite aluminum composite fractional thickness of 0.55, is calculated to have the following properties:

$K_{h,l} = 192$ W/mk
$K_{h,t} = 192$ W/mk
$A_{h,l} = 6.6$ ppm/K
$A_{h,t} = 6.6$ ppm/K
$E_{h,l} = 150$ GPa
$E_{h,t} = 150$ GPa For ease of performing calculations in the interactive process of designing a hybrid, the calculation of the hybrid properties can be provided by a straightforward program such as the BASIC program set forth at the end of this description.

The foregoing has been a disclosure of a hybrid composite having advantageously controllable expansion and thermal conductivity characteristics, and is advantageously utilized in structures such as electronic circuit chassis structures for electronic circuits so that the thermal expansion characteristics of the chassis can be closely matched to that of the circuit carrying substrate bonded to the chassis so as to avoid stress induced failures. Further as to the use of the hybrid composite in an electronic chassis structure, the thermal conductivity is advantageously increased to increase reliability.

Although the foregoing has been a description and illustration of specific embodiments of the invention, varous modifications and changes thereto can be made by persons skilled in the art without departing from the scope and spirit of the invention as defined by the following claims.

```
10 INPUT "enter grapite volume fraction in gr-al";V
15 INPUT "enter fraction of gr-al crossplies in long.
    direction";X
20 INPUT "enter fraction of hybrid comprised of
    gr-al";T
25 INPUT "enter parrticulate volume fraction in Pal";VP
26 REM
27 REM basic material properties
28 REM
```

```
-continued
30 ALGR=-.0000016:KLGR=500:KTGR=29:ELGR=
   6.8E+11 :REM graphite
40 AAL =.000023:KAL=189:EAL=6.8E+10:REM
   aluminum
41 REM
42 REM unidirectional graphite aluminum properties
43 REM
50 ATGAL=AAL
60 ALGAL=(.59*V*ALGR*ELGR+(1-V)*AAL*EAL)/
   (V*ELGR+(1-V) *EAL)
70 KLGAL=V*KLGR+(1-V)*KAL
80 KTGAL=1/(V/KTGR+(1-V)/KAL)
90 ELGAL=V*ELGR+(1-V)*EAL
100 ETGAL= (1-V)*EAL
101 REM
102 REM cross ply graphite aluminum properties
103 REM
110 KXGALL=X*KLGAL+(1-X)*KTGAL
120 KXGALT=X*KTGAL+(1-X)*KLGAL
130 AXGALL=(X*ALGAL*ELGAL+(1-X)*ATGAL*
    ETGAL)/(X*ELGAL+(1-X)*ETGAL)
130 AXGALT=(X*ATGAL*ETGAL+(1-X)*ALGAL*
    ELGAL)/(X*ETGAL+(1-X)*ELGAL)
150 EXGALL=X*ELGAL+(1-X)*ETGAL
160 EXGALT=X*ETGAL+(1-X)*ELGAL
161 REM
162 REM particulate-aluminum properties
163 REM
170 KPAL=179-199*VP-131*VP*VP
180 APAL=23-76*VP+171*VP*VP-151*VP*VP*VP
190 APAL=APAL*.000001
200 EPAL=68+188*VP:EPAL=EPAL*1E+09
201 REM
202 REM hybrid composite properties
203 REM
210 KHL=T*KXGALL+(1-T)*KPAL
220 KHT=T*KXGALT+(1-T)*KPAL
230 AHL=(T*AXGALL*EXGALL+(1-T)*APAL*EPAL)/
    (T*EXGALL+
    (1-T)*EPAL)
240 AHT=(T*AXGALT*EXGALT+(1-T)*APAL*EPAL)/
    (T*EXGALT+(1-T)*EPAL)
250 EHL=T*EXGALL+(1-T)*EPAL
260 EHT=T*EXGALT+(1-T)*EPAL
261 REM
262 REM output results
263 REM
264 PRINT
270 PRINT USING "fraction of gr-al formed by graphite
    =.##"; V
271 PRINT USING "fraction of cross plies oriented in the
    long. direction =.##";X
272 PRINT USING "fraction of hybrid thickness comprised
    of gr-al = .##";T
273 PRINT USING "fraction of Pal formed by particulate
    =.##";VP
274 PRINT
280 PRINT "thermal conductivity (W/mK): ";"khl=";KHL,
    "kht= ";KHT
290 PRINT "thermal expansion (ppm/K): ";"ahl= ";AHL*1E
    +09, "aht= "; AHT*1E+09
300 PRINT "modulus (GPa): ";"ehl= ";EHL*1E-09, "eht=
    ";EHT*1E-09
```

```
-continued
301 PRINT:PRINT
310 STOP
```

What is claimed is:

1. A composite article comprising:
   a layer of particulate reinforced metal comprising aluminum reinforced with ceramic powder; and
   a layer of graphite fiber reinforced metal bonded to said particulate reinforced metal layer, wherein the overall properties of the bonded composite are determined by controlling the properties of said respective metal layers.

2. The article of claim 1 wherein said layer of particulate reinforced metal includes up to about 55% particulate reinforcement by volume.

3. The article of claim 1 wherein said layer of graphite fiber reinforced metal includes up to about 60% graphite fibers by volume.

4. The article of claim 1 wherein said layers are bonded by diffusion bonding.

5. The article of claim 1 wherein said ceramic powder comprises silicon carbide.

6. The article of claim 1 wherein said ceramic powder comprises boron carbide.

7. The article of claim 1 wherein said graphite reinforced metal layer comprises aluminum.

8. A chassis structure for supporting electronic circuits mounted on a predetermined substrate, comprising:
   a layer of particulate reinforced metal comprising aluminum reinforced with ceramic powder; and
   a layer of graphite fiber reinforced metal bonded to said particulate reinforced metal layer, wherein the thermal expansion characteristics of the bonded layers are matched to the thermal expansion characteristics of the predetermined substrate by controlling the properties of said respective metal layers.

9. The chassis structure of claim 8 wherein said layer of particulate reinforced metal includes up to about 55% particulate reinforcement by volume.

10. The chassis structure of claim 8 wherein said layer of graphite fiber reinforced metal includes up to about 60% graphite fibers by volume.

11. The chassis structure of claim 8 wherein said layers are bonded by diffusion bonding.

12. The chassis structure of claim 8 wherein said ceramic powder comprises silicon carbide.

13. The chassis structure of claim 8 wherein said ceramic powder comprises boron carbide.

14. The chassis structure of claim 8 wherein said graphite reinforced metal layer comprises aluminum.

* * * * *